United States Patent
Greiss

(10) Patent No.: US 8,044,743 B2
(45) Date of Patent: Oct. 25, 2011

(54) METHOD AND APPARATUS FOR PULSE POSITION MODULATION

(75) Inventor: Israel Greiss, Ra'anana (IL)

(73) Assignee: DSP Group Limited (IL)

( * ) Notice: Subject to any disclaimer, the term of this patent is extended or adjusted under 35 U.S.C. 154(b) by 144 days.

(21) Appl. No.: 12/410,383

(22) Filed: Mar. 24, 2009

(65) Prior Publication Data

US 2010/0244974 A1    Sep. 30, 2010

(51) Int. Cl.
H03K 7/08 (2006.01)
H03F 3/38 (2006.01)
(52) U.S. Cl. ............................. 332/109; 330/10; 375/238
(58) Field of Classification Search .................. 332/107, 332/108, 109, 112; 330/251, 207 A, 10; 375/238, 239; 341/143, 144
See application file for complete search history.

(56) References Cited

U.S. PATENT DOCUMENTS 7,411,447 B2 *   8/2008  Chang ............................. 330/10
2007/0194827 A1 *   8/2007  Braun ........................... 327/172

* cited by examiner

Primary Examiner — Ryan Johnson
(74) Attorney, Agent, or Firm — Trenton A. Ward, Esq.; Troutman Sanders LLP

(57) ABSTRACT

A method for reducing the transition rate of a pulse width modulated signal representing an original signal having a predetermined frequency range of interest and producing an output signal, the method including the steps of: combining pulses from a predetermined number of consecutive frames into a combined pulse; and positioning the combined pulse within the predetermined number of consecutive frames, such that the output signal has substantially the same Fourier Transform phase as the pulse width modulated signal, for at least the predetermined frequency range of interest of the original signal.

12 Claims, 6 Drawing Sheets

METHOD AND APPARATUS FOR PULSE POSITION MODULATION

TECHNICAL FIELD

The present disclosure relates to signal processing in general, and to methods for pulse position modulation, in particular.

BACKGROUND

A pulse width modulated (PWM) signal is generally a pulse sequence, wherein the width of each pulse is indicative of the input value of the signal. Pulse width modulation has many uses, for example in class D amplifiers, which operate in on/off modes and drive the load directly from the power supply, and are relatively efficient since they have small or minimal internal resistance.

However, PWM signals suffer from a number of problems. One problem relates to the transition rate of the signal. An ideal pulse has an infinite slope, i.e. zero rise time and fall time. A real pulse has a finite slope, meaning that the signal cannot switch from the logical low value to the logical high value, or vice versa, in zero time, and some time is required for switching. The energy losses of devices using PWM signals, such as class D amplifiers, increase as the transition rate of the signal increases. Energy losses occur on every transition, due to the energy required to switch the amplifier from OFF state to ON state, in addition to charge and discharge capacities, including parasitic capacities via serial resistance.

Therefore, it may be desirable to decrease the transition rate of the signal. However, in Sigma-Delta (SD) modulation or multi-level SD modulation, the signal-to-noise ratio (SNR) is improved as the oversampling ratio (OSR) increases, thus increasing the transition rate.

Thus, in order to reduce the AC losses and increase efficiency, it would be desirable to reduce the transition rate, while maintaining SNR performance. One approach for achieving this goal is to design a class D amplifier as described in FIG. 1, by using noise shaping digital-analog-converter 100 for converting the digital signal having a particular rate into an oversampled SD signal having two or more levels. The SNR of the noise shaping modulator increases as the OSR between the input signal and the SD rate is increased. The oversampling SD signal is fed into pulse width modulator 104, which provides stimuli to a class D driver 108 and through a low pass filter 112 to the load. The transition rate of this implementation is very high, therefore the efficiency of the class D amplifier implemented this way is limited.

An alternative solution for reducing energy losses while maintaining SNR involves decimation of the SD signal, so that the transition rate is reduced. However, good decimation of a signal requires an increase in the resolution of the output signal beyond the decimation ratio, which can require a clock rate which is non-feasible for digital implementation. A simple first order decimation by an integer R refers to summing every R consecutive samples, and generating one sample having the combined length. The output range of such sample is R times the original range. However, there is one output pulse instead of every R pulses, so the same system clock can be used. Further, simple down sampling a sigma-delta signal by a factor of R, causes the output range to be extended by a factor of R. Accurate decimation requires the extension of the output range by more than R, and may thus be infeasible due to the resolution being limited by available system clocks.

Due to the folding effect, caused by noise in the high frequencies part being added to the signal in the low frequencies part, simple decimation suffers from degraded SNR performance in the relevant frequency band, such as frequencies under 20 KHz, which are the human audible frequencies.

A known technique for decimating a signal involves accurate decimation, which reduces the high frequencies using a good low pass filter, but imposes higher clock rate requirements. Yet another known problem associated with PWM signals is the harmonic distortion, which is usually more severe when lower transition rate and wider pulses are used. The harmonic distortion is the result of effective sampling jitter which is correlated with the input samples. For normal PWM where each pulse starts at the beginning of its time frame, i.e. is left-aligned in its time-frame, the wider a pulse is, the later is the effective sampling time of the pulse. Thus, for a pure sinusoidal signal, the positive peak is shifted to the right while the negative peak is not shifted at all.

Referring now to FIG. 2, showing an original pure sinusoidal graph 200, and a distorted signal 204, which is the result of correlated jitter. The distorted signal coincides with the original signal on the low points 208, 208' and 208", and reaches maximal distortion on the high points 212, 212' and 212".

The effective sampling time suffers from a variable delay which may be up to half the time frame or the widest pulse, since the effective sampling time occurs in the middle of each pulse. Therefore, the overall peak-to-peak jitter is equal to half of the widest pulse, then reducing the pulse width by increasing the transition rate, reduces the distortion as well. However, as detailed above, reducing the pulse width will increase the transition rate and thus increase energy losses.

If the starting point of each pulse is changed to a random timing within the frame rather than left-aligned, the harmonic distortion will indeed reduce, but at the price of its energy spreading over the audio band, and adding a fixed background noise which is particularly disturbing in low level inputs.

Another known technique used is named Barrel Shifting in which each pulse starts at the phase at which the previous one ended. If overflow occurs, then rotation is used. This technique produces fixed jitter but spreads the spurious harmonics over the whole sampling range, and thus adds fixed noise.

There is thus a need in the art for a method for modified PWM signal, so that jitter and transition rate are reduced so that energy losses are reduced while SNR is not harmed, without requiring resolution higher than the maximal available system clock.

SUMMARY

Embodiments of the present invention include a method for reducing the transition time of a pulse width modulated signal, in order to reduce energy losses of devices using the signal.

A first aspect of the disclosure relates to a method for reducing transitions from a pulse width modulated signal representing a signal having a predetermined frequency range of interest and producing an output signal, the method comprising the steps of: combining pulses from a predetermined number of consecutive frames into a combined pulse; and positioning the combined pulse within the predetermined number of consecutive frames, such that the output signal has substantially the same Fourier Transform phase as the pulse width modulated signal, for at least the predetermined frequency range of interest of the original signal. Within the method the predetermined frequency range of interest comprises human audible frequencies. Within the method, the positioning step is optionally performed by positioning an odd combined pulse so that the odd combined pulse ends at the end of the predetermined number of frames, and positioning an even combined pulse immediately following the odd combined pulse so that the even combined pulse starts at the beginning of the predetermined number of frames. Within the method, the positioning step is optionally performed by: for any combination of an odd combined pulse which is combined from a first group of the predetermined number of frames, and an immediately following even combined pulse which is combined from a second group of the predetermined number of frames: if the odd combined pulse is of zero duration, centering the even combined pulse within the second group of predetermined number of frames; if the even combined pulse is of zero duration, centering the odd combined pulse within the first group of predetermined number of frames; and otherwise positioning the odd combined pulse so that it ends at the end of the first group of predetermined number of frames, and positioning the even combined pulse so that it starts at the beginning of the second group of predetermined number of frames. Within the method, the positioning step is optionally performed by: determining a first moment value for a joined pulse, the joined pulse combined from: an odd combined pulse which is combined from a first group of pulses within a first group of a predetermined number of frames, the odd combines pulse positioned so that it ends at the end of a first group of a predetermined number of frames, and an even combined pulse which is combined from a second group of pulses within a second group of a predetermined number of frames, the even combined pulse positioned so that it starts at the beginning of the second group of a predetermined number of frames, the moment value determined around a middle point of the first group of the predetermined number of frames and the second group of the predetermined number of frames; determining a second moment value for the first group of pulses and the second group of pulses, around a middle point of the first group of the predetermined number of frames and the second group of the predetermined number of frames; determining a difference value between the first moment value and the second moment value; and shifting the joined pulse in a number of clock cycles, the number of clock cycles determined so that an error value, determined as the difference value minus the number of clock cycles multiplied by the duration of the joined pulse, is smaller than half the duration of the joined pulse. The method can further comprise a step of adding to the difference value a previously determined error value, determined for previous pulses. The method is optionally used for enhancing a pulse modulated signal stimulating an amplifier so as to reduce energy loss.

Another aspect of the disclosure relates to a method for reducing jitter distortion from a pulse width modulated signal representing a signal having a predetermined bandwidth and producing an output signal, the method comprising the steps of: combining a first group of pulses from a first group of predetermined number of consecutive frames into an odd combined pulse; combining a second group of pulses from a second group of predetermined number of consecutive frames into an even combined pulse; and positioning the odd combined pulse so that it ends at the end of the first group of predetermined number of frames, and positioning each even combined pulse so that it starts at the beginning of the second group of predetermined number of frames. Within the method, the positioning step is optionally performed by positioning each odd combined pulse so that it ends at the end of the predetermined number of frames, and positioning each even combined pulse so that it starts at the beginning of the predetermined number of frames. The method is optionally used for enhancing a pulse modulated signal stimulating an amplifier so as to reduce energy loss.

Yet another aspect of the disclosure relates to a method for enhancing a second order Sigma-Delta Digital to Analog Convertor, to achieve SNR performance substantially as a fourth order Sigma-Delta Digital to Analog Convertor, the method comprising joining together every sequence of predetermined number of pulses of the Sigma-Delta Digital to Analog Convertor. Within the method, the predetermined number is optionally eight.

BRIEF DESCRIPTION OF THE DRAWINGS

The various embodiments of the present invention will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
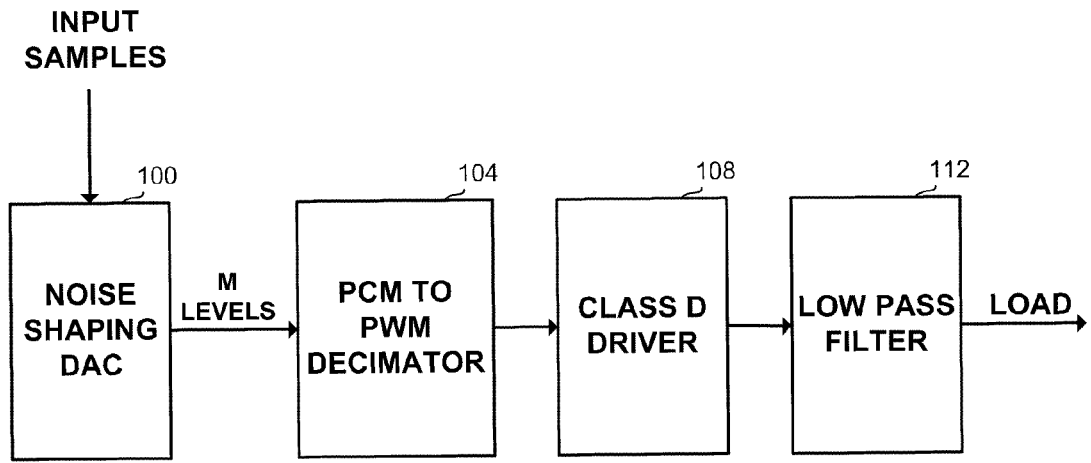
FIG. 1 is a block diagram of class-D amplifier in which noise shaping and a PWM modulator is used.
Figure 2:
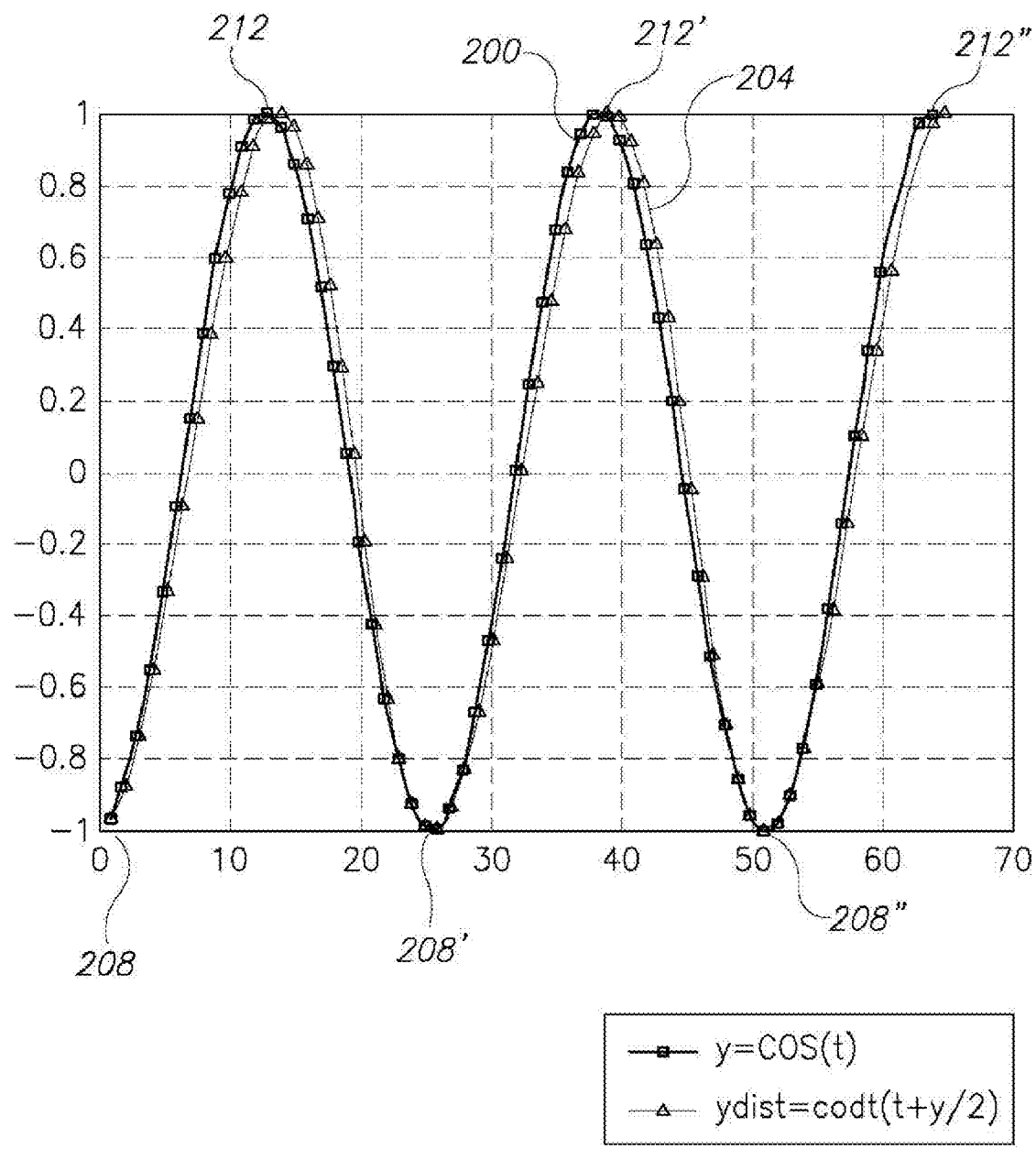
FIG. 2 is a graph of a pure sinusoidal input signal, together with a graph of the distortion caused by correlated jitter.

Embodiments of the disclosed method provide for manipulating a width modulated signal (PWM) in a manner that reduces jitter and transition rate, as well as maintaining the signal noise ratio (SNR), mainly for low level input signals. Some embodiments also maintain the SNR for higher level input signals.

Embodiments of the disclosed method teach the replacement of a multiplicity of pulses by a single pulse, thus reducing the jitter and transition rate. The single pulse should have a duration and position so that the Fourier Transform of the original pulses has significantly the same phase as the Fourier Transform of the combined signal in the frequency range of interest, such as low frequencies, also referred to as the low bins, and thus not degrading the low frequencies, such as the audible frequencies. The low frequencies are relative to the sampling rate. For example for audio signals which are generally in the range of 4-8 KHz, with over sampling rate (OSR) in the range of about 1000 (i.e. a few MHz), then "low frequencies" relate to frequencies between direct current (DC) to about 10 KHz, i.e., to frequencies below $\frac{1}{500}$ of the sampling rate.

Yet another viewpoint for positioning the combined pulse relates to positioning the combined pulse at a position within the combined time frame, so that the combined pulse has the same moment as the accumulated moment of the separate original pulses in the original frames, relatively to the middle point of the combined time frames.

Some alternative methods or approaches are disclosed in which the Fourier Transform of the combined signal has substantially the same phase as the Fourier Transform of the original pulses, or the resulting combined pulses have substantially the same moment as the original pulses.

One method relates to joining every multiple pulses into joined pulses, and positioning the joined pulses by mirroring the odd pulses. In the mirroring embodiment, optionally every predetermined number of pulses are combined into a single pulse. Each odd combined pulse is then joined with the following even combined pulse. Thus, the mirroring approach discloses positioning the odd pulses so that the odd pulses end at the end of the respective time frames, and positioning the even time frames so that they start at the beginning of their respective time frame, so that each odd pulse is thus joined with the following even pulse and the combined pulse ends at the original end time of the original pulse. If the odd pulse originally occurred at the beginning of its time frame, then time-switching means mirroring the pulse within its timeframe. The jitter is thus reduced by reducing the number of pulses.

Another disclosed alternative relates to joining each pair of odd and even combined pulses, and positioning the joined pulse so that its moment is as close as possible to the moment of the original pulses.

Yet another disclosed alternative relates to positioning the joined signal so that its moment is as close as possible to the moment of the original pulses, while taking into account and compensating for moment errors made in positioning preceding pulses.

In a regular digital implementation of width modulated signal, each pulse $L_i$, starts at the beginning of a frame, wherein the length of each frame is M clock cycles. When using the mirroring method, the odd pulses, i.e. $L_i$ for odd "i"s, start at timing $M-L_i$ within the respective frame, and end at time M. Thus, every odd pulse is joined to the following even pulse, and the transition rate is reduced by half.

The jitter of a signal depends on the width of the pulses. More specifically, the jitter depends on the effective sampling time which occurs in the weighted center, i.e. the center of gravity of each pulse. Thus, the wider the original pulse, the higher the jitter. However, when the pulse is mirrored, the wider the pulse, the earlier it starts, so the center of gravity occurs earlier and so does the jitter. Therefore, when a mirrored pulse is joined with another pulse, the positive jitter of the second pulse is cancelled by the negative jitter of the first pulse.

Figure 3A:
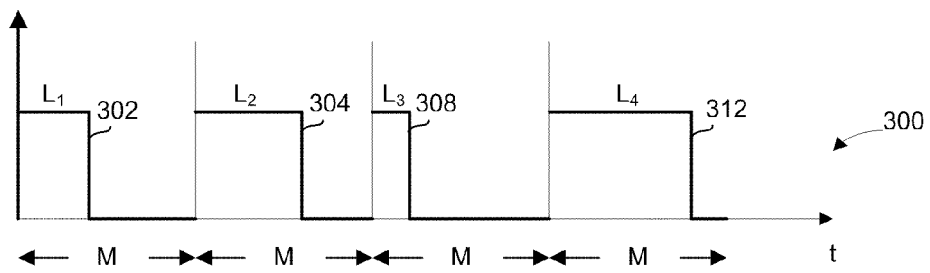
FIGS. 3A, 3B, 3C and 3D show schematic illustrations of pulses and various methods of positioning combined pulses, in accordance with the disclosure.
Figure 3B:
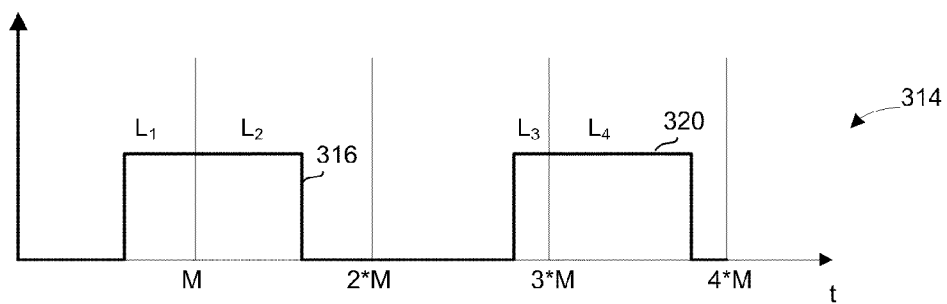

Referring now to FIGS. 3A and 3B, showing a schematic illustration of an example for mirroring a signal. The graph of FIG. 3A, generally referenced 300, shows a signal having four exemplary pulses 302, 304, 308 and 312, having widths $L.sub.1$, $L.sub.2$, $L.sub.3$, and $L.sub.4$, respectively. Each pulse starts at the beginning of its respective frame. The graph of FIG. 3B, generally referenced 314, shows the signal with the odd pulses mirrored. Thus, pulse 302 is mirrored within its respective time frame, and starts at time $M-L.sub.1$, and pulse 308 is mirrored and starts at time $3*M-L.sub.3$. The resulting signal has pulse 316 whose length is equal to $L.sub.1+L.sub.2$ which starts at time $M-L.sub.1$, and pulse 320 whose length is equal to $L.sub.3+L.sub.4$, which starts at time $3*M-L.sub.3$.

The combined pulses have lower jitter than the jitter of the separate pulses, and particularly lower than the jitter caused by adjoining pulses as taught in the prior art. Also, the transition rate is reduced by half, resulting in less energy loss by the switches of a class D amplifier receiving the signal.

It will be appreciated by a person skilled in the art that the disclosed method of mirroring the odd pulses can be extended and combined with ordinary down sampling. When combining, every R pulses wherein each pulse is in a separate window of length M, are combined to generate one pulse having a length equal to the sum of the length of the pulses, out of a window having a length of $R*M$. Then every odd combined pulse is mirrored so that it ends at the respective combined time window, and be attached to the combined pulse starting at the beginning of the following even frame.

In one embodiment of the mirroring approach, if the odd or the even combined pulse is missing, i.e. none of the R frames contained a signal, then the other (even or odd, respectively) pulse is not joined to the end or the beginning of its respective time frame, but rather centered in respect to its timeframe, since the negative jitter or the positive jitter are missing, and cannot compensate for each other.

As disclosed above, methods or approaches other than the mirroring approach can be used for positioning the combined pulse within the $2*M$ window. As discussed above, simply mirroring the odd (or similarly the even) pulses, so that each odd pulse is joined to the following even pulse is simple and reduces the jitter while substantially maintaining the SNR. However, mirroring is particularly useful for improving low level signals, and other solutions may be required for handling high level signals. The reason for the performance being better with low level signals than with high level signals is that in low levels signals, the duration of most pulses is close to the average length, so that the difference from optimal positioning is small. Therefore, positioning using the mirroring approach provides high performance for low level signals.

Figure 3C:
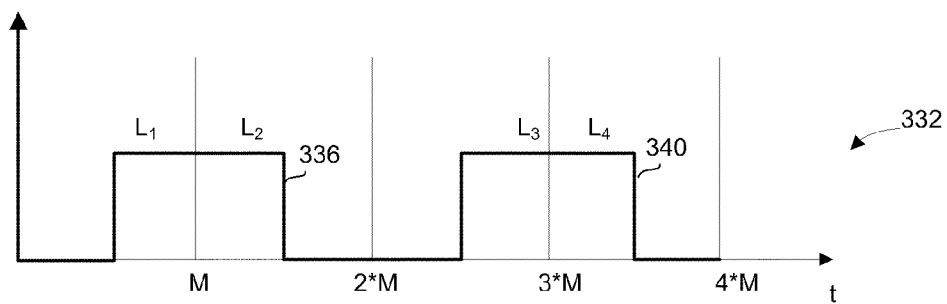
Figure 3D:
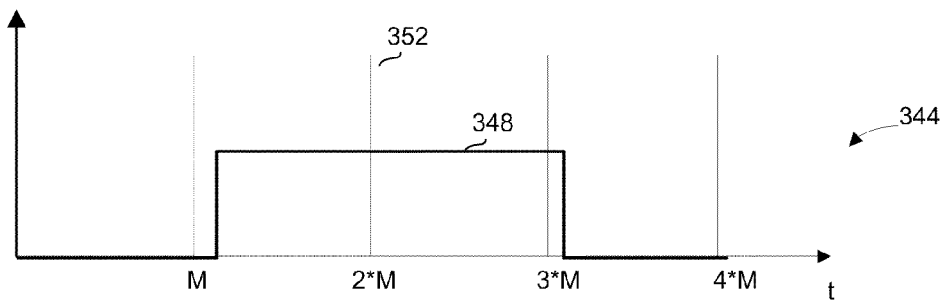

Referring now to FIGS. 3C and 3D, an alternative approach for positioning the joined pulse within its time frame is shown in FIG. 3C and relates to centering the combined pulse relatively to the combined time frame. Joined pulse 336, whose length is equal to $L_1+L_2$ starts at time $(2*M-L_1-L_2)/2$, and pulse 340 whose length is equal to $L_3+L_4$, starts at time $3*M-(L_3+L_4)/2$.

Centering the pulse within the combined time frame would make the positive and negative jitter cancel each other and provide low jitter, but only if the decimation stage was accurate, which as detailed above requires higher resolution. Therefore, centering the pulse does generally not provide adequate results.

Yet another alternative timing is aimed at positioning the combined pulse at a position within the combined time frame, so that the joined pulse has the same moment as the moment accumulated from the separate pulses in the original frames, relatively to the middle point of the combined time frames. In accordance with this approach, the joined pulse is positioned so that the moment of the combined pulse is substantially equal to the moment of the original pulses, thus providing a signal with substantially the same phase of Fourier Transform, without performing the Fourier transform. The moment is evaluated by multiplying the length of each pulse by the average distance of the pulse from the reference point, wherein in this case the reference point is between the two combined time frames.

FIG. 3D presents positioning a joined signal in accordance with the moment approach. Pulse 348, combined of $L_1$, $L_2$, $L_3$, and $L_4$, is positioned in respect to its $4*M$ time frame, such that the moment of pulse 348 is equal to the accumulated moments of $L_1$, $L_2$, $L_3$, and $L_4$, in respect to the middle point of the time frame, being time $2*M$ 352.

Further details about determining a position according to the moment approach are provided further below in association with FIG. 4.

Figure 4:
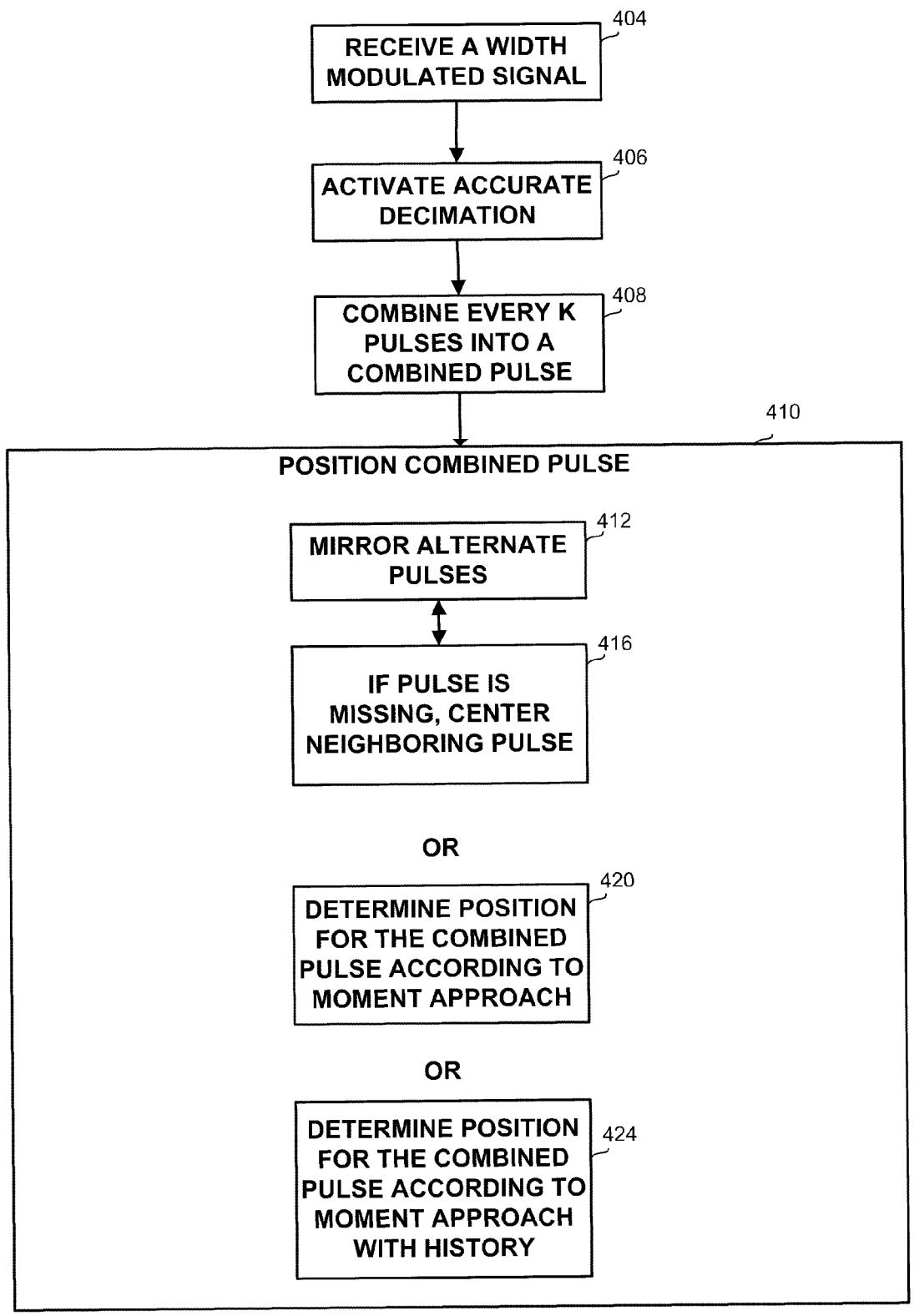
FIG. 4 shows a flowchart of the main steps in a method for reducing transition rate in a width modulated signal, in accordance with the disclosure.

Referring now to FIG. 4, it illustrates a flowchart of several main steps in a method for reducing the transition rate of a width modulated signal.

The method starts by receiving a width modulated signal on step 404. The signal comprises frames, wherein each frame comprises a single logical pulse, referred to as a "1" pulse.

The method comprises optional step 406 of activating accurate decimation on the input signal. As discussed above, accurate decimation implies an increase in the system clock, and can therefore be performed only if such increase is possible.

On optional step 408, every R frames are combined into a single longer frame having a size of R times the length of the original frames, with a single pulse whose length is equal the sum of the pulses within the R original frames. If R is equal to 1, step 408 is practically omitted.

On step 410, a position is determined for the combined pulse within its time frame, i.e. within the R frames.

One option for positioning the combined pulse is to mirror alternate pulses on step 412, such as the odd or the even pulses. Mirroring is performed by positioning a "1" pulse having a duration of the combined R pulses after a "0" part having a duration of the "0" parts, within a first group of R frames, so that the first combined "1" pulse is attached to the second combined "1" pulse, resulting in the 2*R frames comprising a single "1" pulse of a width equal to the sum of the width of the odd "1" combined pulse and the width of the even "1" combined pulse. If any of the combined odd pulse or the combined even pulse is missing, i.e. has zero duration, then on step 416 the other pulse is not mirrored but rather centered within its R frames. The joined pulse reduces the transition rate, and thus the energy losses in a followed device, such as a class D amplifier receiving the signal. However, the mirroring provides jitter reduction mainly for low level input signals.

In order to provide jitter reduction also for high level signals, another alternative is used, which positions the combined pulse in accordance with the moment approach. Thus, on step 420 which is alternative to step 412 and 416, a position is determined for the combined "1" pulse within the 2*R frames, so as to reduce the jitter of the signal, in accordance with the moment approach. According to the moment approach, it is required to position the combined "1" pulse so that it has substantially the same moment, i.e. the same center of gravity as the accumulation of the original pulses, relatively to the middle of the combined time frame, i.e. the end of the first half of the frames. Determining the exact moment of the combined pulse is performed by multiplying the duration of each pulse by its time distance from the middle point, and accumulating over the pulses, i.e. performing convolution of the duration and distance vector. It will be appreciated that the time distance is negative for the first half of the frames, and positive for the second half. Then the combined "1" pulse should be repositioned in order to minimize the moment difference between the original pulses and the combined pulse.

In yet another alternative, step 424 is used for positioning the combined pulse according to the moment approach, while compensating for moment errors causes in preceding pulses.

The moment approach can be formulated as follows: a sequence X of input pulse width modulated frames includes 2*R frames, wherein each frame has a one pulse length $L_i$ is denoted as follows:

$$X = [L(1), L(2), \ldots L(R), L(R+1), L(R+2), \ldots L(2*R)];$$

The method is aimed at replacing the 2*R pulses by a single pulse located at an optimal location which produces equal moment as the original group of frames, relatively to the middle point of the 2*R time frames. In order to determine the contribution of a group of pulses, the contribution of all pulses should be integrated. A Shift right, i.e., delaying the pulse of a sample of duration 1, adds 1 to the moment, and left shift decreases 1 from the moment. The original pulses consist of two groups of R pulses each, wherein each pulse is located within an M sample time slot. The optimal timing, to which the moment should be similar, is that each sample is centered exactly in the center of its time slot, i.e., at M/2 samples. The middle point of the combined frame is located at position M*R. Similarly to the mirroring approach which positions the combined pulse around this point, the optimal shift operation is determined, which is required to be performed on the combined pulse. Determining the moment around the overall center point can be described as integrating the moment of all samples, each consisting of its level multiplied by its distance.

The first pulse of the second group of R pulses is centered at distance M/2 from the overall mid point; the following samples are located M samples apart from each other. Therefore the moment of this group around the midpoint is determine by convoluting the X vector and the locations as follows:

$$\text{Moment2} = \sum_{i=0}^{R} X(R+i) * (i+0.5) * M$$

wherein the operation is actually performed as a convolution operator.

The moment of the first group is determined in an analogous manner, but with negative coefficients. Thus, $$\text{Moment1} = -\sum_{i=0}^{R} X(R-i-1) * (i-0.5) * M$$

and the overall moment of original group around mid point is:

Moment=Moment$_1$+Moment$_2$;

The phase contribution of a single combined pulse positioned according to the Mirror algorithm is:

$Dm = (L_2^2 - L_1^2)/2$ wherein $L_1$ is the sum of lengths of the first group of R pulses, and $L_2$ is the sum of lengths of the second group of R pulses length.

The moment difference between the original moment and the moment of the mirrored position is: De=Moment−Dm. In order to determine the optimal time shift required to position the combined pulse, the difference is divided by the combined pulse length $L_t = L_1 + L_2$.

In order to reduce the complexity of the convolution operation used in determining Moment$_1$ and Moment$_2$, which requires multiplication operations, and to reduce the complexity of the division operation, the following algorithm is disclosed:

$D=0; L_1=0; L_2=0;$ for i=R to 1

$L_1 = L_1 + X(R-i+1)$ $L_2 = L_2 + X(R+i)$ $D = D + L_2 - L_1$ end $D = D * M/2$ $L_t = L_1 + L_2$ $Dm = (L_2 - L_1) * (L_1 + L_2)/2$ The moment error: De=D−Dm can be compensated for, by shifting the mirrored pulse. However, since the pulse is shifted by full clock cycles, each left shift in one clock cycle decrements De by $L_t$. Therefore, once abs(De)<($L_t$/2), no further correction is performed with time resolution.

Since by shifting the combined pulse by one clock cycle the moment is increased or decreased by the length of the combined pulse, (multiplied by the signal value which can be ignored since it is the same for the original pulses and the combined pulse), then if the pulse is shifted further, the error will start growing in the other direction.

In order to compensate for the part of the error which is due to limited system clock resolution, an additional improvement is disclosed, which refines the result by carrying the residual moment error from previous pulses to the next group calculation.

In this optional stage, the residual error of De is not reset at the beginning of the convolution, and is accounted for, in the next group calculation.

If either $L_1$ or $L_2$ equals to zero, the correct position for the combined pulse is around the middle of its time frame. If $L_t$=0, i.e. the combined pulse is of zero duration, no new D is to be determined.

Thus, the resulting complexity is as follows: for every M*2*R system cycles, there are: 4*R+1 add operations, 2 multiplication operations and a limited number of compare operations for implementing the division by $L_t$, which is bounded by design to M*R/4.

The moment approach, and in particular the moment approach with the historical corrections provide better jitter reduction also in high level input signals.

It will be appreciated by a person skilled in the art that other methods can be designed for positioning the combined pulses. The methods can be designed for purposes including those discussed above, such as reducing jitter, or other purposes associated with the signal itself or a device receiving the signal.

Figure 5:
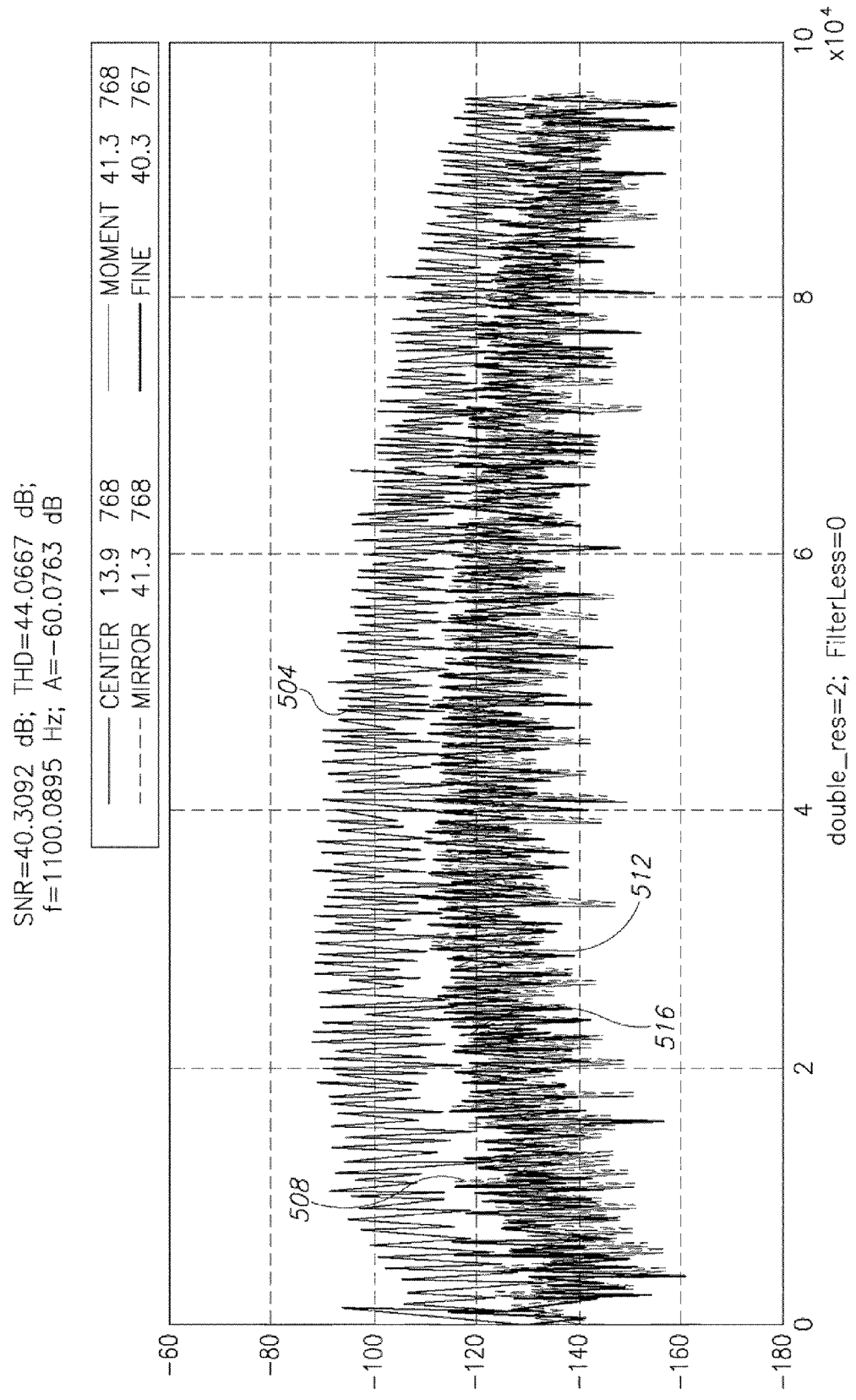
FIG. 5 shows graphs comparing the performance of class D amplifiers employing different methods for positioning the PWM pulses in low level signals.

Referring now to FIG. 5, comparing the performance of the four approaches, being mirroring, centering, the moment approach and the fine approach, for low level signals, such as −60 dB Full Scale (Fs). For low level signals, the centering approach, represented as graph 504 yielded about 14 dB, while the three other approaches, namely the mirroring approach represented as graph 508, the moment approach represented as graph 512 and the fine approach represented as graph 516 all yield about 41 dB, gaining about 27 dB above the centering approach, and delivering a dynamic range of 101 dB.

Figure 6:
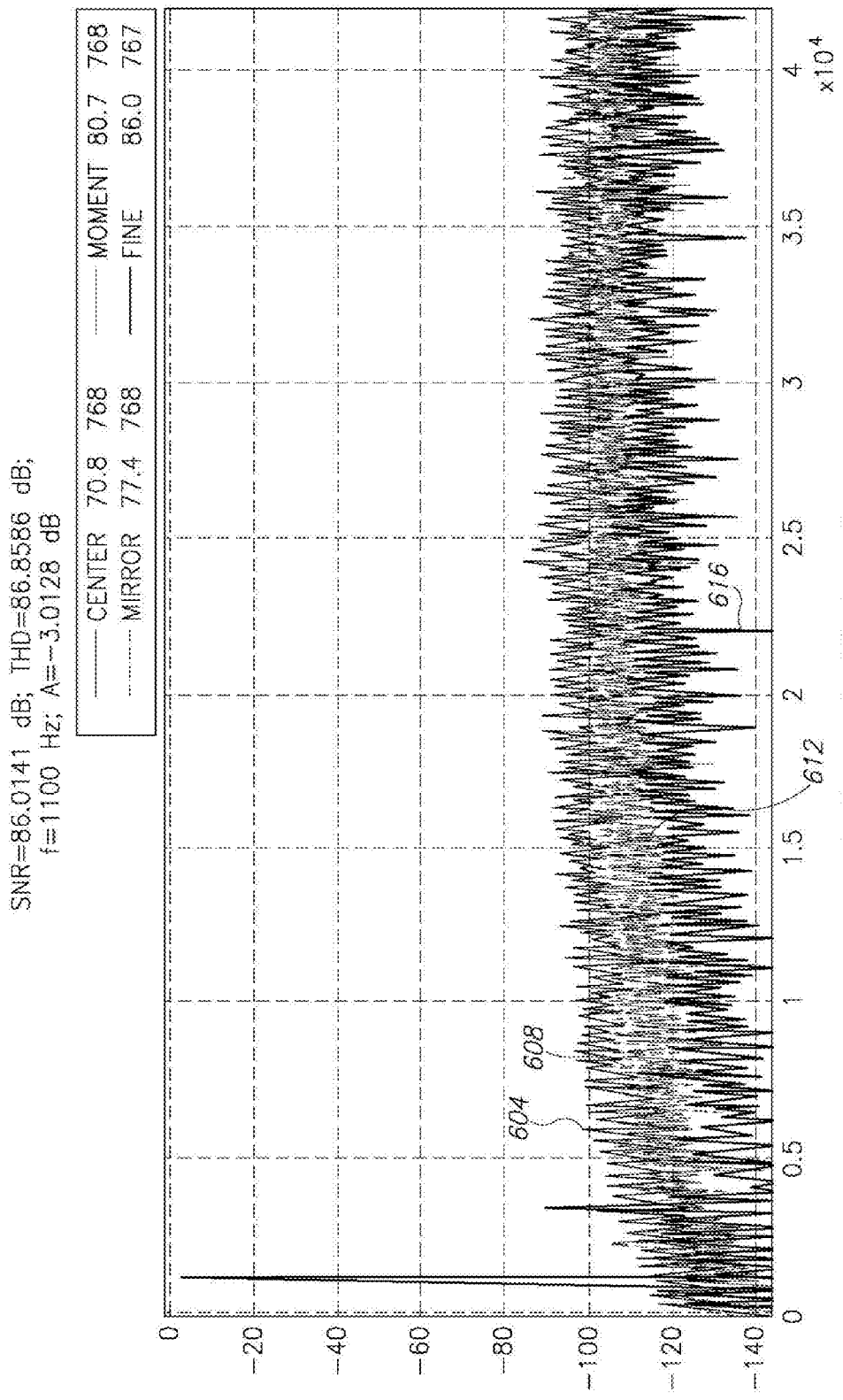
FIG. 6 shows graphs comparing the performance of class D amplifiers employing different methods for positioning the PWM pulses in high level signals.

Referring now to FIG. 6, comparing the performance of the four approaches, being mirroring, centering, the moment approach and the fine approach, for high level input signals, such as −3 dBFS (Full Scale). For high level signals, the naïve centering approach, represented as graph 604 yielded about 70.8 dB, while the namely the mirroring approach represented as graph 608 yielded about 77.4 dB, the moment approach represented as graph 612 yielded about 80.7 fB, and the fine approach represented as graph 616 yielded about 86 dB.

Thus, for low level signals, the mirroring approach provides results which are comparable to more complex methods such as the moment approach and the fine approach. For higher level signals, the performance of the mirroring approach is slightly lesser than the performance of the moment approach and the fine approach.

It will be appreciated by a person skilled in the art that the mirroring approach can also be used for multi-bit Sigma-Delta (SD) digital to analog converter (DAC) implementation using a single bit output level, having a transition rate lower than a noise shaping DAC having a higher order. The method of mirroring a pulse or a combined group of pulses can thus be of use for turning a multi-level SD signal, wherein the difference between adjacent levels is low, into an analog signal.

For example, a second order SD at over sampling rate of 128, produces SNR of about 101 dB. In order to achieve the same SNR with an oversampling rate of 16, a fourth order SD should be used. Alternatively, joining together every eight pulses of the second order SD can achieve the same performance. This can be seen from the following formula providing the performance of an SD DAC of any order N:

$$SNR = -10 * \log_{10}((\pi^{(2*N)}/(2*N+1))+(20*N+10)* \log_{10}(Fs/(2*Fb))),$$

wherein N is the order of the SD DAC (2 or 4 in this case), Fs is the sampling rate (128 or 128/8=16, in this case), and Fb is the Nyquist band-width.

Embodiments of the disclosed method provide for enhancing a PWM signal by determining a position for single pulses or combined pulses, resulting in Pulse Positioning and width modulation (PPWM). The method is aimed at reducing the transition rate of a PWM signal, and thus reducing energy losses of devices such as class D amplifiers stimulated by the signal, while decreasing the jitter and thus the SNR of the signal.

The method discloses optionally summing every R pulses of a signal having a frame duration of M clock cycles, to receive frames of R*M duration, each having a single pulse. The combined pulses are then positioned so as to reduce the jitter.

In one alternative, odd pulses are mirrored within their respective time frames, so that each odd pulse is attached to the following even pulse. Mirroring the odd pulses determines the position of the combined pulse. This approach provides jitter reduction particularly for low level signals.

Although it may be suggested that the combined pulse is positioned symmetrically within its time frame, when simple decimation like simple summing is used, the jitter reduction is too low, since the jitter is not cancelled.

In order to enhance and reduce jitter from high level input signals as well, and thus handle wider dynamic range of the pulse width, another approach is taken. The moment or center of gravity of the original pulses comprised in the combined pulse is determined, and the combined pulse is shifted in time to achieve the same moment as the original pattern of pulses. The resulting signal thus has the same Fourier transform as the original signal, at least for some of the low frequencies. Thus, if the signals of interest are audio signals which are generally in the range of up to 10 KHz, the relevant sampling rate is in the order of magnitude of a few MHz.

A further enhancement can be achieved by compensating for the residual moment error, resulting from the restricted system clock. In such enhancement, the residual error is taken into account and compensated for when positioning the next pulse, thus providing historical correction and better overall positioning of the pulses.

The mirroring or otherwise repositioning of the pulses is optionally performed by dedicated hardware.

A person skilled in the art will appreciate that multiple variations can be designed without deviating from the guidelines of the disclosure. For example, it may be possible to mirror the even pulses rather than the odd pulses, schemes involving more than two pulses can be designed, repositioning can follow any other scheme, including random reposition, or the like.

It will also be appreciated that the disclosure is not limited to any particular frequency range or type of input signals, but can be applied to any type and frequency range of interest of the original input signals.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation, material, step of component to the teachings without departing from the essential scope thereof. Therefore, it is intended that the disclosed subject matter not be limited to the particular embodiment disclosed as the best mode contemplated for carrying out this invention, but only by the claims that follow.

I claim:

1. A method for reducing the transition rate of a pulse width modulated signal representing an original signal having a predetermined frequency range of interest and producing an output signal, the method comprising the steps of:
    combining pulses from a predetermined number of consecutive frames into a combined pulse; and
    positioning the combined pulse within the predetermined number of consecutive frames, such that the output signal has substantially the same Fourier Transform phase as the pulse width modulated signal, for at least the predetermined frequency range of interest of the original signal.

2. The method of claim 1 wherein the predetermined frequency range of interest comprises human audible frequencies.

3. The method of claim 1 wherein the positioning step is performed by positioning an odd combined pulse so that the odd combined pulse ends at the end of the predetermined number of frames, and positioning an even combined pulse immediately following the odd combined pulse so that the even combined pulse starts at the beginning of the predetermined number of frames.

4. The method of claim 1 wherein the positioning step is performed by:
    for any combination of an odd combined pulse which is combined from a first group of the predetermined number of frames, and an immediately following even combined pulse which is combined from a second group of the predetermined number of frames:
    if the odd combined pulse is of zero duration, centering the even combined pulse within the second group of predetermined number of frames;
    if the even combined pulse is of zero duration, centering the odd combined pulse within the first group of predetermined number of frames; and
    otherwise positioning the odd combined pulse so that the odd combined pulse ends at the end of the first group of predetermined number of frames, and positioning the even combined pulse so that the even combined pulse starts at the beginning of the second group of predetermined number of frames.

5. The method of claim 1 wherein the positioning step is performed by:
    determining a first moment value for a joined pulse, the joined pulse combined from:
    an odd combined pulse which is combined from a first group of pulses within a first group of a predetermined number of frames, the odd combines pulse positioned so that it ends at the end of a first group of a predetermined number of frames, and
    an even combined pulse which is combined from a second group of pulses within a second group of a predetermined number of frames, the even combined pulse positioned so that it starts at the beginning of the second group of a predetermined number of frames, the moment value determined around a middle point of the first group of the predetermined number of frames and the second group of the predetermined number of frames;
    determining a second moment value for the first group of pulses and the second group of pulses, around a middle point of the first group of the predetermined number of frames and the second group of the predetermined number of frames;
    determining a difference value between the first moment value and the second moment value; and
    shifting the joined pulse in a number of clock cycles, the number of clock cycles determined so that an error value, determined as the difference value minus the number of clock cycles multiplied by the duration of the joined pulse, is smaller than half the duration of the joined pulse.

6. The method of claim 5 further comprising a step of adding to the difference value a previously determined error value, determined for previous pulses.

7. The method of claim 1 wherein the method is used for enhancing a pulse modulated signal stimulating an amplifier so as to reduce energy loss.

8. A method for reducing jitter distortion from a pulse width modulated signal representing an original signal having a predetermined frequency range of interest and producing an output signal, the method comprising the steps of:
    combining a first group of pulses from a first group of predetermined number of consecutive frames into an odd combined pulse;
    combining a second group of pulses from a second group of predetermined number of consecutive frames into an even combined pulse; and
    positioning the odd combined pulse so that the odd combined pulse ends at the end of the first group of predetermined number of frames, and positioning the even combined pulse so that the even combined pulse starts at the beginning of the second group of predetermined number of frames.

9. The method of claim 8 wherein the positioning step is performed by positioning each odd combined pulse so that the odd combined pulse ends at the end of the predetermined number of frames, and positioning each even combined pulse so that the even combined pulse starts at the beginning of the predetermined number of frames.

10. The method of claim 8 wherein the method is used for enhancing a pulse modulated signal stimulating an amplifier so as to reduce energy loss.

11. The method of claim 1, wherein the pulse width modulated signal is provided by a Sigma-Delta Digital to Analog Convertor.

12. The method of claim 11 wherein the predetermined number of consecutive frames is eight.

* * * * *